United States Patent [19]

Hall

[11] Patent Number: 4,842,358
[45] Date of Patent: Jun. 27, 1989

[54] APPARATUS AND METHOD FOR OPTICAL SIGNAL SOURCE STABILIZATION

[75] Inventor: David B. Hall, La Crescenta, Calif.

[73] Assignee: Litton Systems, Inc., Beverly Hills, Calif.

[21] Appl. No.: 17,426

[22] Filed: Feb. 20, 1987

[51] Int. Cl.$^4$ ............................ G01B 9/02; H01S 3/13
[52] U.S. Cl. .................................. 350/96.15; 250/205; 350/96.29; 372/32
[58] Field of Search ..................... 372/29, 32; 250/201, 250/205; 350/96.15, 96.29

[56] References Cited

U.S. PATENT DOCUMENTS

| | | | |
|---|---|---|---|
| 3,102,953 | 9/1963 | Wallace | 356/350 |
| 3,395,270 | 7/1968 | Speller | 364/453 |
| 3,411,849 | 11/1968 | Aronowitz | 331/94.5 |
| 3,503,005 | 3/1970 | Mocker | 356/350 |
| 3,512,890 | 5/1970 | McLaughlin | 356/350 |
| 3,530,402 | 9/1970 | Doyle et al. | 331/94.5 |
| 3,588,253 | 6/1971 | Wittmann | 356/93 |
| 3,588,738 | 6/1971 | Goodwin | 331/94.5 |
| 3,625,589 | 12/1971 | Snitzer | 350/96.29 |
| 3,627,422 | 12/1971 | Chodorow | 250/199 |
| 3,645,603 | 2/1972 | Smith | 350/149 |
| 3,697,887 | 10/1972 | Lee et al. | 331/94.5 |
| 3,743,969 | 7/1973 | Hutchings | 356/350 |
| 3,807,866 | 4/1974 | Zingery | 356/350 |
| 3,827,000 | 7/1974 | Matsushita et al. | 332/7.51 |
| 3,854,819 | 12/1974 | Andringa | 356/350 |
| 4,013,365 | 3/1977 | Vali et al. | 356/106 |
| 4,039,260 | 8/1977 | Redman | 356/106 |
| 4,081,670 | 3/1978 | Albanese | 250/199 |
| 4,101,847 | 7/1978 | Albanese | 331/94.5 |
| 4,109,217 | 8/1978 | Brackett et al. | 331/94.5 |
| 4,153,331 | 5/1979 | Cross | 350/96.20 |
| 4,158,151 | 6/1979 | Grundler | 307/312 |
| 4,177,436 | 12/1979 | Dixon et al. | 331/94.5 |
| 4,181,901 | 1/1980 | Heyke | 331/94.5 |
| 4,187,475 | 2/1980 | Weider | 331/94.5 |
| 4,237,427 | 12/1980 | Holland | 331/94.5 |
| 4,265,541 | 5/1981 | Le Clerc et al. | 356/350 |
| 4,268,116 | 5/1981 | Schmadel et al. | 350/96.29 |
| 4,292,606 | 9/1981 | Trimmel | 332/7.51 |
| 4,299,490 | 11/1981 | Cahill et al. | 356/350 |
| 4,305,046 | 12/1981 | Le Floch et al. | 331/94.5 |
| 4,307,469 | 12/1981 | Casper et al. | 455/613 |
| 4,344,173 | 8/1982 | Straus | 372/38 |
| 4,349,906 | 9/1982 | Scifres et al. | 372/50 |
| 4,372,646 | 2/1983 | Strahan et al. | 350/96.31 |
| 4,372,685 | 2/1983 | Ulrich | 356/350 |
| 4,385,387 | 5/1983 | Trimmel | 372/29 |
| 4,386,822 | 6/1983 | Bergh | 350/96.15 |
| 4,389,090 | 6/1983 | LeFevre | 350/96.29 |
| 4,410,275 | 10/1983 | Shaw et al. | 356/350 |
| 4,456,377 | 6/1984 | Shaw et al. | 356/350 |
| 4,461,574 | 7/1984 | Shaw et al. | 356/350 |
| 4,465,336 | 8/1984 | Huber et al. | 350/96.30 |
| 4,469,397 | 9/1984 | Shaw et al. | 350/96.15 |
| 4,473,270 | 9/1984 | Shaw | 350/96.15 |
| 4,480,915 | 11/1984 | Arditty et al. | 356/350 |
| 4,493,528 | 1/1985 | Shaw et al. | 350/96.15 |
| 4,494,969 | 1/1985 | Bhagavatula | 65/3.12 |
| 4,529,262 | 7/1985 | Ashkin et al. | 350/96.15 |

(List continued on next page.)

FOREIGN PATENT DOCUMENTS

| | | |
|---|---|---|
| A21958/83 | 6/1984 | Australia . |
| A21776/83 | 6/1984 | Australia . |
| A31642/84 | 2/1985 | Australia . |
| A18491/83 | 3/1985 | Australia . |
| 1154955 | 11/1983 | Canada . |
| 0093942 | 4/1983 | European Pat. Off. . |
| 1807247 | 9/1971 | Fed. Rep. of Germany ...... 356/350 |

(List continued on next page.)

OTHER PUBLICATIONS

Kaminow, "Balanced Optical Discriminator", *Applied Optics,* 1964, vol. 3, No. 4, pp. 507–510.

(List continued on next page.)

*Primary Examiner*—John D. Lee
*Attorney, Agent, or Firm*—Lynn & Lynn

[57] ABSTRACT

The frequency of an optical signal output from an optical source is controlled by dividing a signal output from the source into two signal portions each of which is guided along its own optical path. The signal portions are combined to form two optical beams each including components of the two signal portions and having intensities dependent on an adjusted frequency of the two beams.

12 Claims, 10 Drawing Sheets

U.S. PATENT DOCUMENTS

| | | | |
|---|---|---|---|
| 4,529,312 | 7/1985 | Pavlath et al. | 356/350 |
| 4,529,313 | 7/1985 | Petermann et al. | 356/350 |
| 4,529,426 | 7/1985 | Pleibel et al. | 65/3.11 |
| 4,530,097 | 7/1985 | Stokes et al. | 372/6 |
| 4,549,781 | 10/1985 | Bhagavatula et al. | 350/96.30 |
| 4,549,806 | 10/1985 | Marten et al. | 356/350 |
| 4,552,578 | 11/1985 | Anderson | 65/29 |
| 4,557,742 | 12/1985 | Thigpen | 65/2 |
| 4,561,871 | 12/1985 | Berkey | 65/3.11 |
| 4,575,187 | 3/1986 | Howard et al. | 350/96.33 |
| 4,588,296 | 5/1986 | Cahill et al. | 356/350 |
| 4,589,728 | 5/1986 | Dyott et al. | 350/96.30 |
| 4,621,925 | 11/1986 | Masuda et al. | 356/350 |
| 4,637,722 | 1/1987 | Kim | 356/350 |
| 4,638,483 | 1/1987 | Bowers | 372/26 |
| 4,653,917 | 3/1987 | Moeller et al. | 356/350 |
| 4,671,658 | 6/1987 | Shaw et al. | 356/350 |
| 4,697,876 | 10/1987 | Dyott | 350/96.29 |
| 4,702,600 | 10/1987 | Handrich et al. | 356/350 |
| 4,717,256 | 1/1988 | Ensley et al. | 356/350 |
| 4,734,911 | 3/1988 | Bruesselbach | 372/29 X |
| 4,735,506 | 4/1988 | Pavlath | 356/350 |

FOREIGN PATENT DOCUMENTS

| | | |
|---|---|---|
| 3104786 | 9/1982 | Fed. Rep. of Germany. |
| 3305104A1 | 2/1983 | Fed. Rep. of Germany. |
| 2566133 | 6/1984 | France. |
| 2007015A | 10/1978 | United Kingdom. |
| 2054949A | 7/1979 | United Kingdom. |
| 2052841A | 5/1980 | United Kingdom. |
| 2068108A | 8/1981 | United Kingdom. |
| 2100855A | 1/1983 | United Kingdom. |
| 2154787A | 1/1984 | United Kingdom. |
| 2168838A | 3/1984 | United Kingdom. |
| 2152207 | 7/1985 | United Kingdom. |
| WO84/03592 | 3/1983 | World Int. Prop. O.. |

OTHER PUBLICATIONS

White, "Frequency Stabilization of Gas Lasers", *Journal of Quantum Electronics*, 1965, vol. QE-1, No. 8, pp. 349-350.

Kimura et al., "Temperature Compensation of Birefringent Optical Filters", *Proc IEEE*, Aug. 1971, pp. 1373-1374.

Davis, J. L. and Ezekiel, S., "Techniques for Shot-Noise-Limited Inertial Rotation Measurement Using a Multiturn Fiber Sagnac Interferometer", *SPIE*, vol. 157, (1978), pp. 131-136.

Fujii, "Optical Fibers With Very Fine Layered Dielectrics", *App. Optics*, vol. 25, No. 7, Apr. 1, 1986, pp. 1061-1065.

Kinter, E. C., "Polarization Problems in Optical Fiber Gyroscopes", *Applied Optics*, vol. 18, No. 9, pp. 78-81.

Lefevre et al., "Progress in Optical Fiber Gyroscopes Using Integrated Optics", p. 12.

Ulrich, R., "Polarization Stabilization on Single-ModeFiber", *Applied Physics Letters*, 35(11), 12/01/79, pp. 840-842.

Pavlath et al., "Fiber Optics Gyroscopes: Advances and Future Developments", *Navigation: Journal of the Institute of Navigation*, vol. 31, No. 2, Summer 1984, pp. 70-83.

Mohr, F. A. & Scholz, U., "Polarization Control For an Optical Fiber Gyroscope", *Fiber Optic Rotation and Related Technology, Springer Verlag*, 1982, pp. 163-168.

Wilson et al., "Magnetostrictive Fiber-Optic Sensor System For Detecting DC Magnetic Fields", *Optics Letters*, Jun. 1983, vol. 8, No. 6, pp. 333-335.

Risk et al., "Single-Sideband Frequency Shifting in Birefringent Optical Fiber", vol. 478, *Fiber Optic & Laser Sensors 2 SPIE*, (1984), pp. 91-97.

Campbell et al., "Rotating-Waveplate Optical-Frequency Shifting in Lithium Niobate", *IEEE Journal of Quantum Electronics*, vol. QE-7, No. 9, Sept. 1971, pp. 450-457.

Vali et al., "Rapid Communications", *Appl. Opt.*, May 1978, vol. 16, No. 5, pp. 1099-1102.

Goss et al., "Fiber Optic Rotation Sensors (FORS) Signal Detection & Processing", *SPIE*, vol. 139 (1978), pp. 76-87.

Vali et al., "Fresnel-Fizeau Effecy in a Rotating Optical Fiber Ring Interferometer", *Applied Optics*, 16,2605, Oct. 16, 1977.

Moss et al., "Photon-Noise Limited Transducer for Gravitational Antenna", *Applied Optics*, 10,2495, 1971 (Nov.).

Stone, J. M., "Radiation and Optics", McGraw-Hill, N.Y., 1963, pp. 405-408 and p. 412.

Vali et al., "Ring Interferometer 950 m Long", Applied Optics, vol. 16, No. 2, Feb. 1977, pp. 290-291.

Lamouroux et al., "Polarization Effect In Optical-Fiber Ring Resonators", Optics Letters, 1982, vol. 7, No. 8, pp. 391-393.

Cahill et al., "Phase-Nulling Fiber-Optic Laser Gyro", Optics Letters, 1979, vol. 4, No. 3, pp. 93-95.

Cumming, "The Serrodyne Frequency Translator", *Proceedings Of The IRE*, Feb. 1957, pp. 175-186.

Sheem et al., "Wavelength Monitoring of Single-Mode Diode Laser Using Gided-Wave Interferometer", *Optics Letters*, May 1980, vol. 5, No. 5, pp. 179-181.

Stolen, "Polarization in Fibers and Couplers", *OFS* Thursday Morning, Feb. 14, 1985, pp. 130-131.

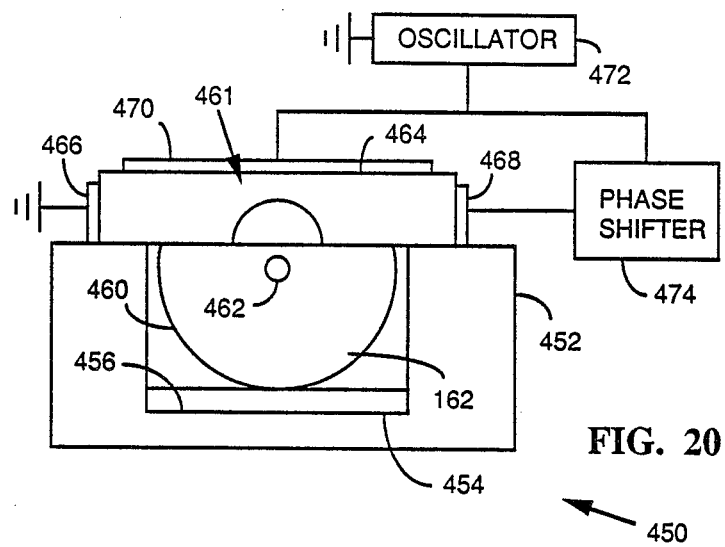
FIG. 20
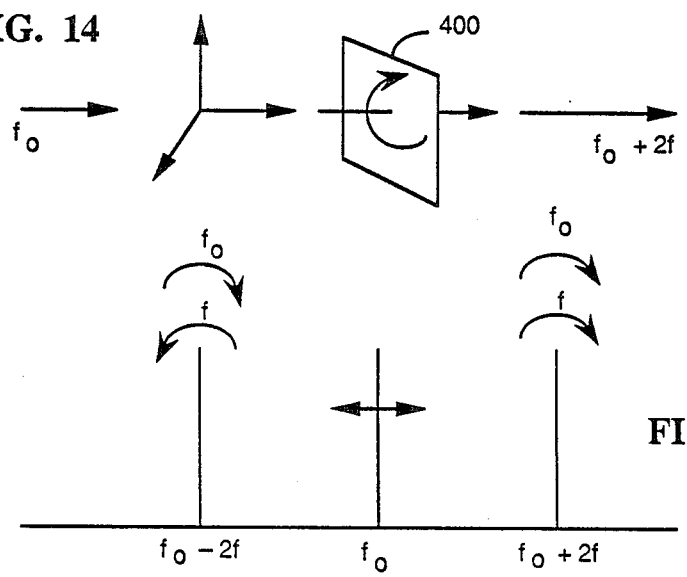
FIG. 14
FIG. 15

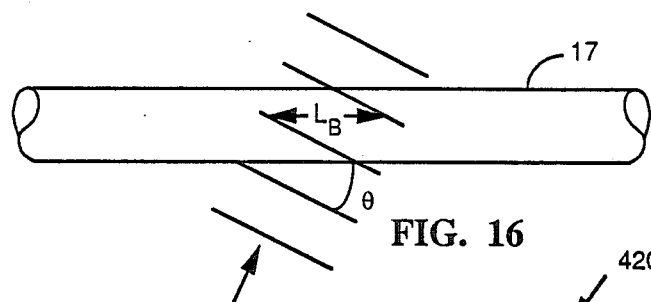
FIG. 16

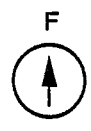   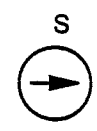
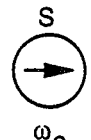  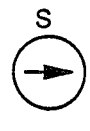 
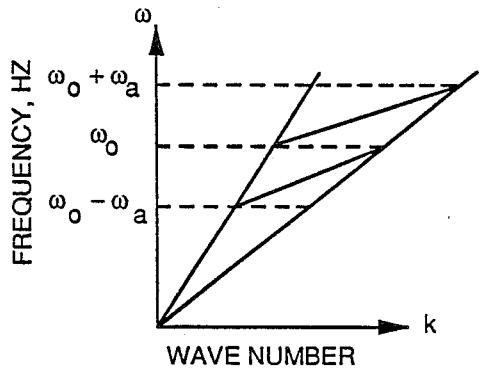 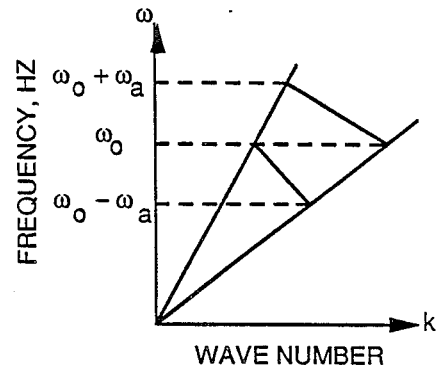
FIG. 18   FIG. 19

APPARATUS AND METHOD FOR OPTICAL SIGNAL SOURCE STABILIZATION

BACKGROUND OF THE INVENTION

This invention relates generally to apparatus and methods for controlling the frequency of light output from an optical signal source. This invention is particularly related to apparatus and methods for controlling the frequency of optical signals output from coherent light sources.

Stability in the optical frequencies input to optical fibers is a practical necessity in the development and implementation of sensing systems using optical fibers. Optical sensing systems may use semiconductor diode lasers or superluminescent diodes as light sources. Fiber optic rotation sensors have been used in broadband semiconductor light sources to reduce noise arising from backscattering in the fiber and for reducing errors caused by the optical Kerr effect. High precision fiber optic rotation sensors required a stable light source the wavelength because the scale factor of the sensor depends upon the source wavelength. For example, a navigation grade rotation sensor requires wavelength stability of about one part in $10^6$.

A wideband source such as a superluminescent diode (SLD) or a narrower source such as a single or multimode laser diode needs frequency stabilization in order to be suitable as an optical source for a Sagnac ring fiber optics rotation sensor.

The SLD provides a spectral linewidth sufficient to overcome unwanted phase errors due to coherent backscatter and the Kerr effect. The fractional linewidth should be between 10 and 1000 parts per million (ppm). The frequency stability of the centroid of the source spectral distribution should be several ppm to meet scale factor stability and linearity requirements. Therefore, source width should be minimized within the constraints of coherent backscatter and Kerr effect errors to enhance scale factor linearity. The fractional linewidth should approach the lower portion of the 10 to 1000 ppm range to minimize unwanted errors in scale factor due to changes in the source spectral distribution over time.

There are at least three groups of laser diodes that are classified according to structure. These are homostructure, single heterostructure and double heterostructure diode lasers.

The simplest diode lasers are called homostructure lasers because they are made of a single semiconductor material. A homostructure laser diode may comprise, for example, regions of n-type and p-type gallium arsenide. Electrons injected from the n-region into the p-region combine with holes, or positive charge carriers, to emit laser light. All laser diodes include two polished parallel faces that are perpendicular to the plane of the junction of the p-type and n-type regions. The emitted light reflects back and forth across the region between the polished surfaces and, consequently is amplified on each pass through the junction.

A typical single heterostructure semiconductor laser includes an additional layer of aluminum gallium arsenide, in which some of the gallium atoms in the gallium arsenide have been replaced by aluminum atoms. The aluminum gallium arsenide layer stops the injected electrons, thereby causing the emission of a higher intensity laser light than ordinarily occurs with a homostructure diode laser.

A typical double heterostructure semiconductor laser includes three layers of gallium arsenide separated by two layers of aluminum gallium arsenide. Preselection of either n-type or p-type materials causes further increases of the intensity of the emitted laser beam.

The wavelength of the light emitted from a laser diode varies as a function of the operating temperature and the injection current applied. Effective use of a laser diode as a light source in an optical rotation sensor requires an output of known wavelength. In fiber optic rotation sensing applications, the frequency stability should be about $\Delta f/f = 10^6$, and the light source should be held at a constant temperature.

Superluminescent diodes used as light sources in fiber optic rotation sensors typically have excessive fractional linewidths of about 10,000 ppm. They also have operating lifetimes of about 100 hours and provide about 500 $\mu$W or less optical power into an optical fiber. SLD's have linewidth to frequency stability ratios of about 10,000 and require relatively high injection currents that typically exceed 100 mA. As a result, the short operating lifetime and excessive linewidths make SLD's unacceptable for fiber optic rotation sensors, which should operate reliably for thousands of hours without source replacement.

Single mode laser diodes have the characteristic that modulation of the injection current produces simultaneous amplitude and frequency modulations of the power output. The amplitude modulation has a modulation depth that approaches 100%. Periodic AM modulation at kilohertz or megahertz rates from below or near threshold to a high peak power can produce an output with a continuous spectral distribution exceeding 20 Ghz. It is possible to produce a chirp frequency modulation of the output frequency that exceeds 20 GHz, which is equivalent to a 50 ppm fractional linewidth at a wavelength $\gamma = 820$ nm. Modulation with a pseudo-random noise source of appropriate spectral density can produce an output with a desired spectral distribution and linewidth. Thus single mode laser diodes have the advantages of providing power inputs to an optical fiber in the range of 1-5 mW, long operating lifetime that exceed 10,000 hours, and a linewidth to frequency stability ratio that is adjustable over a range of about 10 to 100.

Multimode laser diodes have adjustable fractional linewidths that are dependent on the number of longitudinal modes that lase. For a five mode laser, the fractional linewidth may be about 1000 ppm at $\gamma = 820$ nm, which corresponds to a wavelegth change $\Delta\gamma = 0.2$ nm. Injection current modulation at kilohertz or megahertz rates can smear the discrete longitudinal to produce a continuous or quasi-continuous spectral distribution over a fractional linewidth of 1000 ppm. Multimode laser diodes typically provide high power inputs in the range of about 1-10 mW into optical fibers, have operating lifetimes that typically exceed 10,000 hours and have a linewidth to frequency stability ratio in the range of about 100 to 1000.

Some familiarity with polarization of light and propagation of light within an optical fiber will facilitate an understanding of the present invention. Therefore, a brief description of the concepts used to describe the propagation and polarization of a light wave in a fiber is presented.

An optical fiber comprises a central core and a surrounding cladding. The refractive index of the cladding is less than that of the core. The diameter of the core is so small that light guided by the core impinges upon the core-cladding interface at angles less than the critical angle for total internal reflection.

It is well-known that a light wave may be represented by a time-varying electromagnetic field comprising orthogonal electric and magnetic field vectors having a frequency equal to the frequency of the light wave. An electromagnetic wave propagating through a guiding structure can be described by a set of normal modes. The normal modes are the permissible distributions of the electric and magnetic fields within the guiding structure, for example, a fiber·optic waveguide. The field distributions are directly related to the distribution of energy within the structure.

The normal modes are generally represented by mathematical functions that describe the field components in the wave in terms of the frequency and spatial distribution in the guiding structure. The specific functions that describe the normal modes of a waveguide depend upon the geometry of the waveguide. For an optical fiber, where the guided wave is confined to a structure having a circular cross section of fixed dimensions, only fields having certain frequencies and spatial distributions will propagate without severe attenuation. The waves having field components that propagate with low attenuation are called normal modes. A single mode fiber will propagate only one spatial distribution of energy, that is, one normal mode, for a signal of a given frequency.

In describing the normal modes, it is convenient to refer to the direction of the electric and magnetic fields relative to the direction of propagation of the wave. If only the electric field vector is perpendicular to the direction of propagation, which is usually called the optic axis, then the wave is the to be a transverse electric (TE) mode. If only the magnetic field vector is perpendicular to the optic axis, the wave is a transverse magnetic (TM) mode. If both the electric and magnetic field vectors are perpendicular to the optic axis, then the wave is a transverse electromagnetic (TEM) mode.

None of the normal modes require a definite direction of the field components. In a TE mode, for example, the electric field may be in any direction that is perpendicular to the optic axis. The direction of the electric field vector in an electromagnetic wave is the polarization of the wave. In general, a wave will have random polarization in which there is a uniform distribution of electric field vectors pointing in all directions permissible for a given mode. If all the electric field vectors i a wave point in only a particular direction, the wave is linearly polarized. If the electric field consists of two orthogonal electric field components of equal magnitude and a phase difference of 90°, the electric field is circularly polarized, because the net electric field is a vector that rotates around the propagation direction at an angular velocity equal to the frequency of the wave. If the two linear polarizations are unequal or have a phase difference other than 90°, the wave has ellipical polarization. In general, any arbitrary polarization can be represented by the sum of two orthogonal linear polarizations, two oppositely directed circular polarizations or two counter rotating elliptical polarizations that have orthogonal major axes.

The boundary between the core and cladding is a dielectric interface at which certain well-known boundary conditions on the field components must be satisfied. For example, the component of the electric field parallel to the interface must be continuous. A single mode optical fiber propagates electromagnetic energy having an electric field component perpendicular to the core-cladding interface. Since the fiber core has an index of refraction greater than that of the cladding and light impinges upon the interface at angles greater than or equal to the critical angle, essentially all of the electric field remains in the core by internal reflection at the interface. To satisfy both the continuity and internal reflection requirements, the radial electric field component in the cladding must be a rapidly decaying exponential function. An exponentially decaying electric field is usually called the "evanescent field".

The velocity of an optical signal depends upon the index of refraction of the medium through which the light propagates. Certain materials have different refractive indices for different polarizations. A material that has two refractive indices is said to be birefringent. The polarization of the signal propagating along a single mode optical fiber is sometimes referred to as a mode. A standard single mode optical fiber may be regarded as a two mode fiber because it will propagate two waves of the same frequency and spatial distribution that have two different polarizations. Two different polarization components of the same normal mode can propagate through a birefringent material unchanged except for a velocity difference between the two polarizations.

In summary, any polarized light can be represented by two circularly polarized waves having proper phase and amplitude. Alternatively, the light could be represented by either elliptically rotating components or by perpendicular linearly polarized components of the electric field.

There are a number of birefringent materials. Depending on their structure and orientation to the light propagating through it, certain crystals are circularly birefringent; some crystals are linearly birefringent. Other types of crystals, for example quartz, can have both circular birefringence and linear birefringence so as to produce elliptical birefringence for a light wave propagating in a properly chosen direction.

SUMMARY OF THE INVENTION

The present invention provides an apparatus and a method for overcoming the difficulties in stabilizing the frequency of optical signals output from light sources such as those used in optical rotation sensors.

A device according to the invention for controlling the frequency of an optical signal output from an optical signal source comprises means for dividing a signal output from the source into a first signal portion and a second signal portion; means for providing a first optical path for the first signal portion; means for providing a second optical path for the second signal portion; means for combining the first and second signal portions to form a first optical beam and a second optical beam that each includes a component of the first signal portion and a component of the second signal portion, the beams having intensities dependent upon the frequency of the two beams; and means for adjusting the frequency of the optical signal output from the signal source as a function of the difference of the intensities of the first and second optical beams.

The device according to the invention may further comprise means for producing an electrical signal indicative of the difference of the intensities of the first and second beams; an electric current source connected to the optical signal source for providing an injection current thereto; and means for applying the electrical signal to the electric current optical source for controlling the injection current.

The device according to the invention may also further include optical signal guiding means for guiding an optical signal output from the optical signal source, the optical signal guiding means having a pair of principal axes; first polarizing means having a polarization axis oriented at 45° to the principal axes of the optical signal guiding means and positioned to receive an optical signal therefrom; first birefringent means positioned to receive light output from the first polarizing means; second birefringent means positioned to receive light output from the first birefringent means; polarizing beamsplitter means having a polarization axis oriented at 45° to the principal axes of the optical signal guiding means and positioned to receive an optical signal from the second birefringent means; a first photodetector positioned to receive a first output from the polarization sensitive beamsplitter, the first photodetector producing an electrical output having a phase shift indicative of $I_o(1+\cos\phi)$ where $I_o$ is the intensity of the optical beam input to the first birefringent means and $\phi$ is a phase shift between the two beams generated by the first and second birefringent means; a second photodetector positioned to receive a second output from the polarization sensitive beamsplitter, the second photodetector producing an electrical output having a phase shift indicative of $I_o(1-\cos\phi)$; and a differential amplifier connected to the outputs of the first and second photodetectors for producing an error signal indicative of the difference in the frequency of the optical signal output by the optical signal source from a desired frequency.

The device according to the invention may also further include a two beam interferometer for receiving the optical signal output from optical signal source, the interferometer comprising means for dividing the optical signal into two separate beams, a first light path, a second light path, and means for combining waves that have traversed the first and second light paths and producing first and second interferometer outputs; first photodetector means for producing a first electrical signal indicative of the intensity of the first interferometer output; second photodetector means for producing a first electrical signal indicative of the intensity of the second interferometer output; and a differential amplifier connected to the outputs of the first and second photodetectors for producing an error signal indicative of the difference in the frequency of the optical signal output by the optical signal source from a desired frequency.

The method of the invention for controlling the frequency of an optical signal output from a optical source, comprises the steps of dividing a signal output from the source into a first signal portion and a second signal portion; providing a first optical path for the first signal portion; providing a second optical path for the second signal portion; combining the first and second signal portions to form a first optical beam and a second optical beam that each includes a component of the first signal portion and a component of the second signal portion, the beams having intensities dependent upon the frequency of the two beams; and adjusting the frequency of the optical signal output from the signal source as a function of the difference of the intensities of the first and second optical beams.

The method of the invention may further comprise the steps of producing an electrical signal indicative of the difference of the intensities of the first and second beams; connecting an electric current source to the optical signal source for providing an injection current thereto; and applying the electrical signal to the electric current source optical source for controlling the injection current.

The method of the invention may further comprise the steps of guiding an optical signal output from the optical signal source, the optical signal guiding means having a pair of principal axes; placing first polarizing means having a polarization axis oriented at 45° to the principal axes of the optical signal guiding means to receive an optical signal therefrom; placing first birefringent means to receive light output from the first polarizing means; placing second birefringent means to receive light output from the first birefringent means; placing polarization sensitive beamsplitter means having a polarization axis oriented at 45° to the principal axes of the optical signal guiding means to receive an optical signal from the second birefringent means; placing a first photodetector to receive a first output from the polarization sensitive beamsplitter and produce an electrical output having a phase shift indicative of $I_o(1+\cos\phi)$; placing a second photodetector positioned to receive a second output from the polarization sensitive beamsplitter, the second photodetector producing an electrical output having a phase shift indicative of $I_o(1-\cos\phi)$; and connecting a differential amplifier to the outputs of the first and second photodetectors for producing an error signal indicative of the difference in the frequency of the optical signal output by the optical signal source from a desired frequency.

The method of the invention may also further include the steps of receiving the optical signal output from optical signal source with a two beam interferometer; dividing the optical signal into two separate beams, a first light path and a second light path; combining waves that have traversed the first and second light paths and producing first and second interferometer outputs; producing a first electrical signal indicative of the intensity of the first interferometer output; producing a first electrical signal indicative of the intensity of the second interferometer output; and producing an error signal indicative of the difference in the frequency of the optical signal output by the optical signal source from a desired frequency.

BRIEF DESCRIPTION OF THE DRAWINGS

FIGS. 14 and 15 illustrate the effect of a frequency shifter on an optical wave;

FIG. 16 illustrates an acoustic wavefront impinging upon an optical fiber;

FIGS. 18 and 19 illustrate the effect of the acoustooptic frequency shifter of FIG. 17 on an optical signal;

FIG. 20 illustrates a second structure for a frequency shifter that may be included in the fiber optic rotation sensor of FIG. 12;

DESCRIPTION OF THE PREFERRED EMBODIMENT

Figure 1:
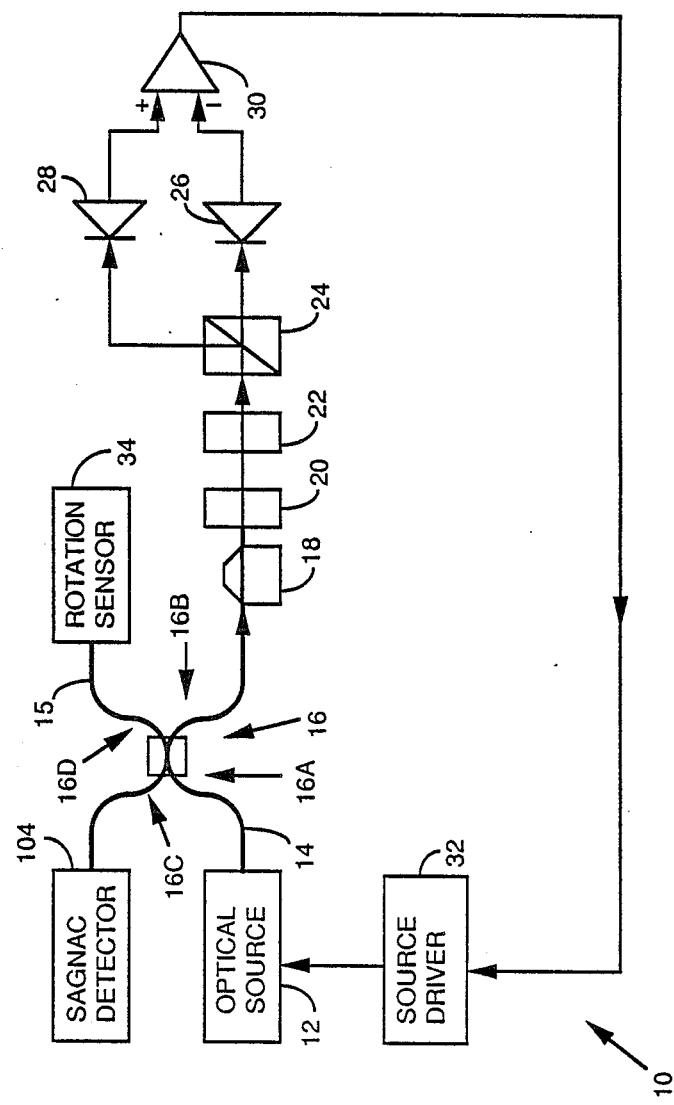
FIG. 1 is a schematic diagram of a first optical source stabilization system according to the invention.

Referring to FIG. 1, an optical source controller system 10 for controlling the wavelength output from an optical signal source 12 includes a pair of optical fibers 14 and 15, an optical coupler 16, a first polarizer 18, a first birefringent crystal 20, a second birefringent crystal 22, a polarization sensitive beamsplitter 24, a first photodetector 26, a second photodetector 28, a differential amplifier 30, and a voltage controlled current source 32.

Figure 9:
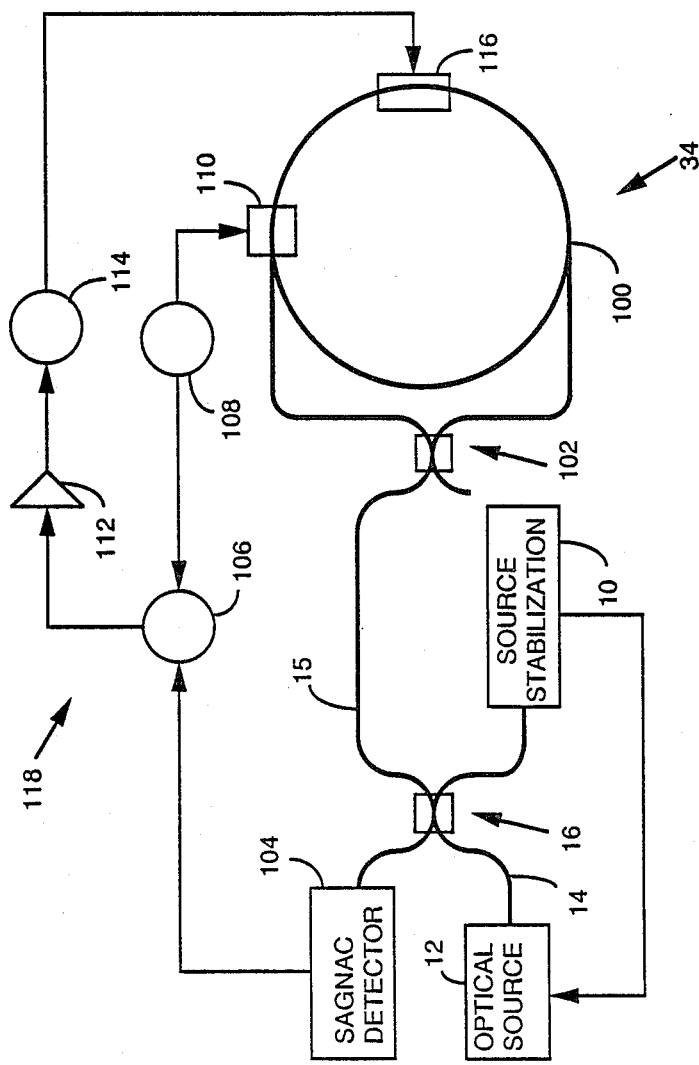
FIG. 9 schematically illustrates a fiber optic rotation sensor that may be used with the optical source stabilization system of FIG. 1.

The optical source 12 is preferably a solid state laser, but it may be a superluminescent diode (SLD). Light from the optical source 12 propagates in the fiber 14 to a port 16A of the coupler 16. A first portion of the incident light cross couples in the coupler 16 and is output at a port 16D into the fiber 15 to be input to other apparatus such as a fiber optic rotation sensor 34. The light output at port 16D may be input to any device for which the optical source 16 is suitable. The fiber optic rotation sensor 34 exemplifies one such device. FIG. 9 shows structural features of the fiber optic rotation sensor 34.

A second portion of the light input to the optical coupler 16 remains in the fiber 14 and is output at a port 16B. This light output at port 16B is the signal that is processed to stabilize the source 12 to provide an optical output signal comprising essentially fixed wavelengths.

The source light output from port 16B of the coupler 16 then propagates in the fiber 14 to the first polarizer 18, which may be either a conventional bulk optics linear polarizer or a fiber optic linear polarizer described subsequently. The polarizer 18 is oriented relative to the fiber 14 such that the linear polarization transmitted through it makes a 45° angle with the principal axes of the fiber 14. The output from the polarizer 18 is therefore equally divided between two orthogonal linear polarizations in the crystals 20 and 22.

The crystals 20 and 22 are birefringent which means that they have polarization-dependent refractive indices. Since the velocity of light in a dielectric medium is $v=c/n$ where n is the refractive index of the medium and c is the free space velocity of light, waves of different polarization have different velocities in the crystals. The polarization having the lower velocity is sometimes called the slow wave and the other polarization is called the fast wave. The polarizer 18 therefore divides the light equally between the fast and slow waves in the crystals 20 and 22.

In general the output of the crystal 22 is an elliptically polarized light wave. The polarization beam splitter 24 therefore provides output intensities of $I_0(1+\cos\phi)$ and $I_0(1-\cos\phi)$, where $\phi$ is the birefringent phase shift generated by the crystals 20 and 22 between the fast and slow waves. At the correct source frequency, the intensities output by the polarizing beam splitter 24 are equal such that $$I_0(1+\cos\phi)=I_0(1-\cos\phi). \tag{1}$$

The two beams output from the polarizing beam splitter 24 are made to be equal by servoing the drive current of the source 12 with a frequency dependent signal indicative of the difference of the two intensities. The beam having intensity $I_0(1+\cos\phi)$ is incident upon a detector 26 while the other beam is incident upon a detector 28. The detectors 26 and 28 form currents $i_1$ and $i_2$, respectively, that are indicative of the intensities of the beams incident thereon. The currents $i_1$ and $i_2$ are input to a difference amplifier 30, which forms a signal indicative of the difference of the currents. The amplified difference signal is input to a current source 32, which supplies the injection current to the light source 12. The frequency of the light output by the source 12 is proportional to the injection current that the optical source 12 receives from the current source 32. The injection current is then controlled by the signal fed back from the current source 32 so that the current is either increased or decreased as necessary to adjust the output frequency to be the desired value.

Figure 2:
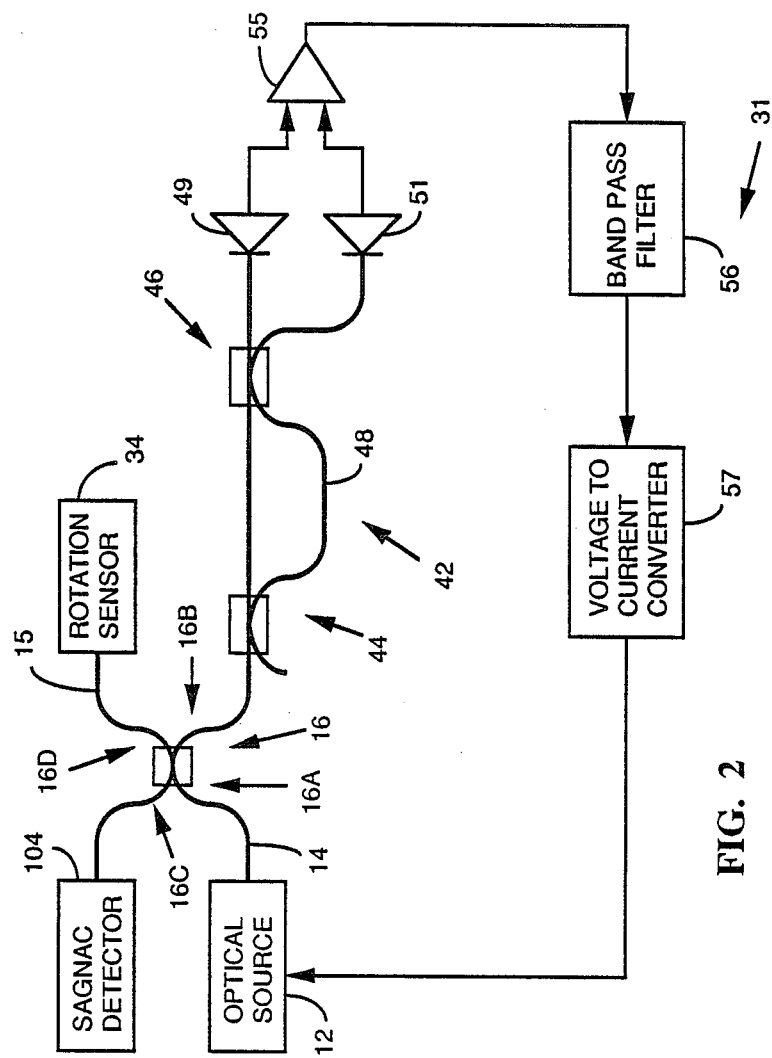
FIG. 2 is a schematic diagram of a second embodiment of a source stabilization system according to the invention.

FIG. 2 illustrates a modified light source control system 31 that is similar to the system 10. Light from the source 12 remaining in the fiber 14 propagates to a Mach-Zehnder interferometer 42. The Mach-Zehnder interferometer 42 comprises a coupler 44, the fiber 14, an optical fiber 48 and a coupler 46. Any type of two beam interferometer such as a Michelson inteferometer (not shown) could be used instead of the Mach-Zehnder interferometer 42 shown in FIG. 2.

In the Mach-Zehnder interferometer 42 a portion of the light input to the coupler 44 is coupled from the fiber 14 into the fiber 48. The lengths of the fiber 14 and the fiber 48 between the couplers 44 and 46 are different. For convenience of explaining the characteristics of the Mach-Zehnder interferometer 42, the portion of the fiber 14 between the couplers 44 and 46 is called the short path, and the length of the fiber 48 between these couplers is called the long path. The coupler 46 couples a portion of the signal that traversed the long path back into the fiber 14 while also coupling a portion of the signal that traversed the short path into the fiber 48. The coupler 46 combines the portion of the signal remaining in the fiber 14 with the signal cross coupled from the fiber 48. The coupler 46 also combines the portion of the signal remaining in the fiber 48 with the signal cross coupled from the fiber 14. Therefore, the outputs of the coupler 46 are superpositions of portions of the signals that traversed the two paths between the couplers 44 and 46. The result of superimposing these signals is the formation of an interference pattern in the two optical outputs from the coupler 46. The positions of the bright and dark lines in this interference pattern are a function of the phase difference $\theta$ between the signals.

The lengths of the fibers 14 and 48 between the couplers 44 and 46 may be chosen such that the signals have a defined phase relationship in the coupler 46 when the optical source 12 outputs a signal of a selected frequency. The portions of the fibers 14 and 48 between the couplers 44 and 46 have an optical path difference of $c\tau$, where c is the velocity of light in the fibers and $\tau$ is the difference in transit times of light between the couplers 44 and 46 in the fibers 14 and 48. In order for the interferometer 42 to provide a stable reference, the optical path difference should be insensitive to changes in temperature.

The outputs of the coupler 46 are input to detectors 49 and 51, which form electrical signals $i_1$ and $i_2$, respectively, that are indicative of the intensities of the optical signals applied to the detectors 49 and 51. The currents $i_1$ and $i_2$ are then input to a differential amplifier 55. The amplified difference signal is then input to a low pass filter 56, which may comprise a series resistor (not shown) and a capacitor (not shown) connected between the resistor and ground. The output of the low pass filter 56 is designated as $V_{LP}$. The signal $V_{LP}$ is then input to a voltage to current generator 57, which forms a current output $i_F = \alpha \alpha V_{LP}$. The current $i_F$ is the servo current that controls the injection current applied to the SLD light source 12.

Referring to FIG. 9, the fiber optic rotation sensor 34 comprises a sensing loop 100 formed in the fiber 15. Part of the light from the optical source 12 cross couples into the fiber 15. The input signal propagates through the fiber 15 to an optical coupler 102 that divides the light to produce light waves that propagate counterclockwise (CCW) and clockwise (CW) through the loop 100. After traversing the loop 100, the waves then impinge upon the optical coupler 102. The optical coupler 102 then combines portions of the waves so that a superposition of the CW and CCW waves propagates back through the fiber 15 to the optical coupler 16, which directs a portion of the combined waves to a Sagnac detector 104, which may be any suitable photodiode.

The output of the Sagnac detector 104 is an electrical signal indicative of the rotation rate of the sensing loop 100 about its sensing axis, which may be a line perpendicular to the plane of the loop. The wave traveling around the loop 100 in the direction of rotation will have a longer transit time in the loop than the wave traveling opposite to the direction of rotation. This difference in transit time is detected as a phase shift in the waves. The amount of phase shift is a function of the rotation rate and the wavelength of the light input to the sensing loop 100. A scale factor relates the rotation rate to the parameters of the sensing system.

The electrical output of the Sagnac detector 104 is input to a summing amplifier 106 that also receives signals from an oscillator 108. The oscillator 108 drives a phase modulator 110 that is formed to adjust the phase of light in the sensing loop 100. The output of the summing amplifier 106 is input to a second amplifier 112 that produces a control signal that is input to an oscillator 114. The oscillator 114 is preferably a voltage controlled oscillator whose output is a function of the voltage output from the amplifier 112. The oscillator 114 drives a frequency shifter 116 that adjusts the frequency of light in the sensing loop. A serrodyne phase modulator (not shown), may be substituted for the frequency shifter 116, in which case a sawtooth wave generator replaces the oscillator 114.

The summing amplifier 106, oscillator 108, phase modulator 110, amplifier, oscillator 114 and frequency shifter 116 (or phase modulator) comprise a phase nulling servo loop 118. In order to provide a wider dynamic range, the servo loop adjusts the light in the loop to null the phase differences caused by rotations of the sensing loop. The rotation rate is determined by measuring the voltage required to drive the oscillator to null the rotation induced phase shift.

A fiber optic directional coupler suitable for use in single mode fiber implementations of the invention as the couplers 16, 44, 46 and 102 of FIGS. 1, 2 and 9 is described in the Mar. 29, 1980 issue of *Electronics Letters*, Vol. 28, No. 28. pp. 260–261 and in U.S. Pat. No. 4,493,528 issued Jan. 15, 1985 to Shaw et al. That patent is assigned to the Board of Trustees of the Leland Stanford Junior University. The disclosure of that patent is hereby incorporated by reference into the present disclosure.

Figure 3:
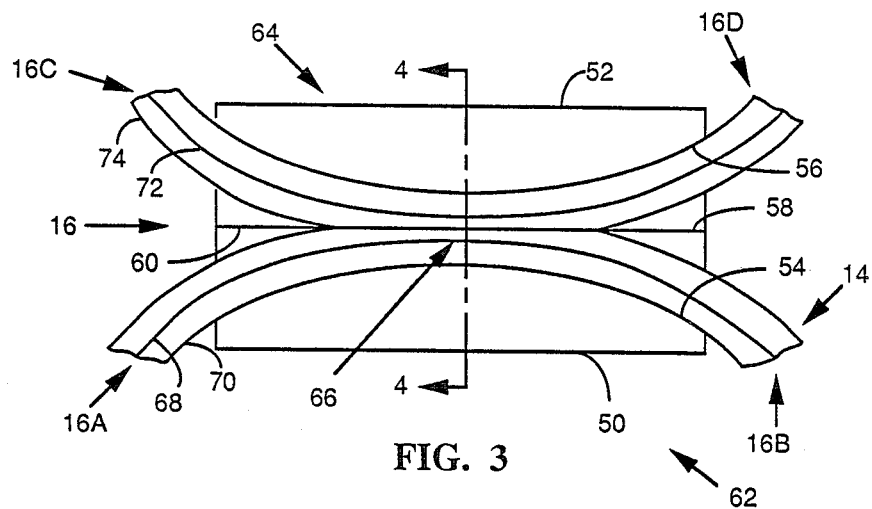
FIG. 3 is a cross sectional view of an optical coupler that may be included in the optical source stabilization systems of FIGS. 1 and 2.
Figure 4:
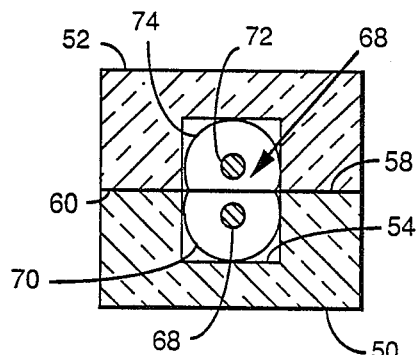
FIG. 4 is a cross sectional view about line 4—4 of FIG. 3.
Figure 5:
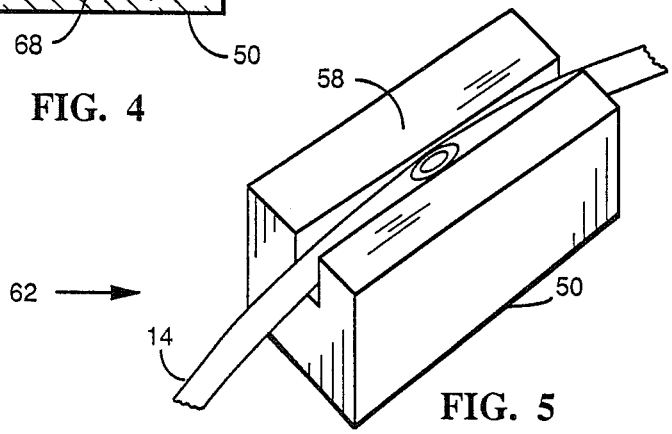
FIG. 5 is a perspective view showing an oval surface on a portion of an optical fiber included in the fiber optic evanescent field coupler of FIGS. 3 and 4.

As illustrated in FIGS. 3–5, the coupler 16 includes the optical fibers 14 and 15 of FIG. 1 mounted in a pair of substrates 50 and 52, respectively. The fiber 14 is mounted in a curved groove 54 formed in an optically flat surface 58 of the substrate 50. Similarly, the fiber 15 is mounted in a curved groove 56 formed in an optically flat surface 60 of the substrate 52. The substrate 50 and fiber 14 mounted therein comprise a coupler half 62, and the substrate 52 and fiber 15 mounted therein comprise a coupler half 64.

The curved grooves 54 and 56 each have a radius of curvature that is large compared to the diameters of the fibers 14 and 15, which are ordinarily substantially identical. The widths of the grooves 54 and 56 are slightly larger than the fiber diameters to permit the fibers 14 and 15 to conform to the paths defined by the bottom walls of the grooves 54 and 56, respectively. The depths of the grooves 54 and 56 vary from a minimum at the center of the substrates 50 and 52, respectively, to a maximum at the edges of the substrates 50 and 52. The variation in groove depth permits the optical fibers 14 and 15, when mounted in the grooves 54 and 56, respectively, to gradually converge toward the centers and diverge toward the edges of the substrates 50 and 52, respectively. The gradual curvature of the fibers 14 and 15 prevents the occurrence of sharp bends or other abrupt changes in direction of the fibers 14 and 15 to avoid power loss through mode perturbation. The grooves 54 and 56 may be rectangular in cross section;

however, other cross sectional configurations such as U-shaped or V-shaped may be used in forming the coupler 16.

Referring still to FIGS. 3–5, at the centers of the substrates 50 and 52, the depths of the grooves 54 and 56 are less than the diameters of the fibers 14 and 15. At the edges of the substrates 50 and 52, the depths of the grooves 54 and 56 are preferably at least as great as the fiber diameters. Fiber optic material is removed from each of the fibers 14 and 15 by any suitable method, such as lapping, to form oval-shaped planar surfaces in the fibers 14 and 15 that are coplanar with the confronting surfaces 58 and 60 of the substrates 50 and 52. The oval surfaces are juxtaposed in facing relationship to form an interaction region 66 where the evanescent field of light propagated by each of the fibers 14 and 15 interacts with the other fiber. The amount of fiber optic material removed increases gradually from zero near the edges of the substrates 50 and 52 to a maximum amount at their centers. As shown in FIGS. 3 and 4, the tapered removal of fiber optic material enables the fibers 14 and 15 to converge and diverge gradually, which is advantageous for avoiding backward reflection and excessive loss of light energy at the interaction region 66.

Light is transferred between the fibers 14 and 15 by evanescent field coupling at the interaction region 66. The optical fiber 14 comprises a central core 68 and a surrounding cladding 70. The fiber 15 has a core 72 and a cladding 74 that are substantially identical to the core 68 and cladding 70, respectively. The core 68 has a refractive index that is greater than that of the cladding 70, and the diameter of the core 68 is such that light propagating within the core 68 internally reflects at the core-cladding interface. Most of the optical energy guided by the optical fiber 14 is confined to its core 68. However, solution of the wave equations for the fiber 68 and applying the well-known boundary conditions show that the energy distribution, although primarily in the core 68, includes a portion that extends into the cladding and decays exponentially as the radius from the center of the fiber increases. The exponentially decaying portion of the energy distribution within the fiber 14 is generally called the evanescent field. If the evanescent field of the optical energy initially propagated by the fiber 14 extends a sufficient distance into the fiber 15, energy will couple from the fiber 14 into the fiber 15.

To ensure proper evanescent field coupling, the amount of material removed from the fibers 14 and 15 must be carefully controlled so that the spacing between the cores of the fibers 14 and 15 is within a predetermined critical zone. The evanescent field extends a short distance into the cladding and decreases rapidly in magnitude with distance outside the fiber core. Thus, sufficient fiber optic material should be removed to permit overlap between the evanescent fields of waves propagated by the two fibers 14 and 15. If too little material is removed, the cores will not be sufficiently close to permit the evanescent fields to cause the desired interaction of the guided waves; and therefore, insufficient coupling will result.

Removal of too much material alters the propagation characteristics of the fibers, resulting in loss of light energy from the fibers due to mode perturbation. However, when the spacing between the cores of the fibers 14 and 15 is within the critical zone, each fiber 14 and 15 receives a significant portion of the evanescent field energy from the other to achieve good coupling without significant energy loss. The critical zone includes the region in which the evanescent fields of the fibers 14 and 15 overlap sufficiently to provide good evanescent field coupling with each core being within the evanescent field of light guided by the other core. It is believed that for weakly guided modes, such as the $HE_{10}$ mode guided by single mode fibers, mode pertubation occurs when the fiber core is exposed. Therefore, the critical zone is the core spacing that causes the evanescent fields to overlap sufficiently to cause coupling without causing substantial mode perturbation induced power loss.

The coupler 16 of FIG. 1 includes four ports labeled 16A, 16B, 16C and 16D. Ports 16A and 16B, which are on the left and right sides, respectively, of the coupler 16 correspond to the fiber 14. The ports 16C and 16D similarly correspond to the fiber 15. For purposes of explanation, it is assumed that an optical signal input is applied to port 16A through the fiber 14. The signal passes through the coupler 16 and is output at either one or both of ports 16B or 16D depending upon the amount of coupling between the fibers 14 and 15. The "coupling constant" is defined as the ratio of the coupled power to the total output power. In the above example, the coupling constant is the ratio of the power output at port 16D divided by the sum of the power output at the ports 16B and 16D. This ratio is sometimes called the "coupling efficiency", which is typically expressed as a percent. Therefore, when the term "coupling constant" is used herein, it should be understood that the corresponding coupling efficiency is equal to the coupling constant times 100.

The coupler 16 may be tuned to adjust the coupling constant to any desired value between zero and 1.0 by offsetting the confronting surfaces of the fibers 14 and 15 to control the dimensions of the region of overlap of the evanescent fields. Tuning may be accomplished by sliding the substrates 50 and 52 laterally or longitudinally relative to one another.

Light that is cross-coupled from one of the fibers 14 and 15 to the other undergoes a phase shift of $\pi/2$, but light that passes straight through the coupler 16 without being cross-coupled is not shifted in phase. For example, if the coupler 16 has a coupling constant of 0.5 and an optical signal is input to port 16A, then the outputs at ports 16B and 16D will be of equal magnitude, but the output at port 16D will be shifted in phase by $\pi/2$ relative to the output at port 16B.

The polarizer 18 described herein may be essentially identical to the polarizer disclosed in U.S. Pat. No. 4,386,822 to Bergh. However other types of polarizers may be satisfactorily used in the present invention. The disclosure of that patent is hereby incorporated by reference into the present disclosure.

Figure 6:
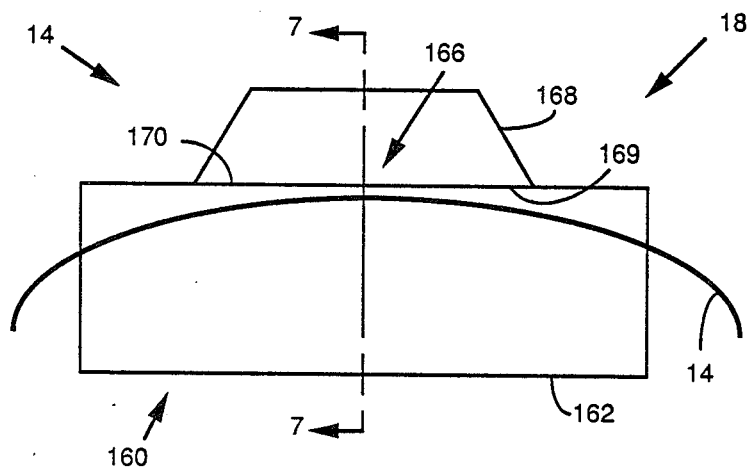
FIG. 6 is a cross sectional view of a polarizer that may be included in the optical source stabilization system of FIG. 1.
Figure 7:
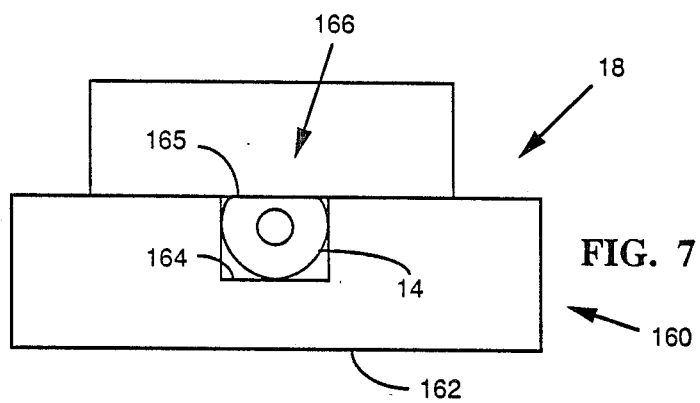
FIG. 7 is a cross sectional view about line 7—7 of FIG. 6.

Referring to FIGS. 6 and 7, the polarizer 18 includes a half coupler 160 that comprises a substrate 162, preferably formed of a quartz block, having a curved groove 164 therein. A length of the optical fiber 14 is secured in the groove 164 shown in FIG. 7. A portion of the substrate 162 has been ground and polished down to form a surface 165 that extends into the cladding of the fiber 14. The grinding and polishing operation removes a portion of the cladding to form an interaction region 166. An optically flat surface 169 of a birefringent crystal 168 is mounted to a surface 170 of the substrate 162. In the interaction region, the evanescent field of light propagating in the fiber 14 interacts with the birefringent crystal 168.

If the fiber 14 is a single mode fiber, then the only modes propagated are those in which the directions of the electric and magnetic fields are approximately perpendicular to the direction of propagation of the wave through the fiber 14.

The crystal 168 is arranged so that for light polarized perpendicular to the crystal-fiber interface, the refractive index of the crystal 168 is less than the refractive index of the fiber 14. Therefore, light propagating within the optical fiber 14 with a polarization perpendicular to the crystal-fiber interface tends to remain in the optical fiber 14 because of internal reflections at the crystal-fiber interface. The index of refraction of the crystal 168 for polarizations parallel to the crystal-fiber interface is chosen to be greater than the index of refraction of the optical fiber 14 so that light polarized parallel to the crystal-fiber interface couples out of the optical fiber 14 into the birefringent crystal 168.

Figure 8:
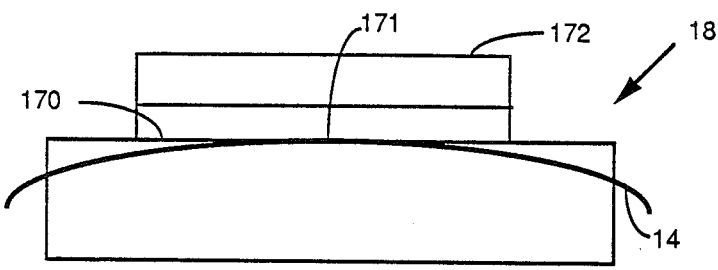
FIG. 8 illustrates a second structure for a polarizer that may be included in the optical source stabilization system of FIG. 1.

Referring to FIG. 8, a second type of polarizer 18A suitable for use in the system 10 includes a layer 175 of a dielectric buffer such as $CaF_2$ adjacent a flattened region 171 on the cladding of the fiber 14. A metal layer 172 is placed on the buffer layer 175. The undesired polarization is attenuated while attempting to propagate in the fiber 14 past the flattened region 171. The desired polarization passes through substantially unattenuated.

There are several types of optical frequency shifters that may be used in the present invention. FIG. 14 illustrates the effect of a frequency shifter on an optical wave. Consider a circularly polarized input light incident upon a half-wave plate 400 that is rotating at an angular velocity f. The input wave is shown to have a frequency $f_o$. The wave is traveling in the positive z-direction and has polarization vectors along the x- and y-axis that are of equal magnitude and 90° out of phase. Therefore, the polarization vector appears to rotate at angular velocity $f_o$ about the z-axis in a clockwise direction when viewed looking toward the direction of propagation. The half-wave plate 400 rotates in the same direction as the polarization vector so that the output wave is frequency shifted from the input frequency $f_o$ to have a frequency of $f_o+2f$.

FIG. 15 graphically represents the possible frequency outputs from the frequency shifter 116 when it is operated as a single-side-band-suppressed-carrier phase shifter. If the input frequency is $f_o$, then rotating the half-wave plate at frequency f in the direction of polarization of the input beam produces an output of $f_o+2f$. Rotating the half-wave plate 400 at the frequency f opposite in direction to the polarization of the circularly polarized input wave produces an output frequency of $f_o-2f$. Controlling the rotational frequency f permits the output frequency of the quarter-wave plate to have a range of $f_o \pm 2f_{max}$ where f max is the maximum rotational frequency of the half-wave plate 400.

The amplitude of the outputs of the frequency shifter 116 is $$\phi(t) = A \exp[i(f_o+2f)t] + B \exp[if_o t]. \quad (2)$$

The intensity of the output wave is the square of the amplitude and is given by $$I = |\phi(t)|^2 \quad (3)$$

$$I = A^2 + B^2 + 2AB \cos(2ft). \quad (4)$$

The coefficient A is ordinarily much larger than B so that $B^2$ is negligible.

Figure 17:
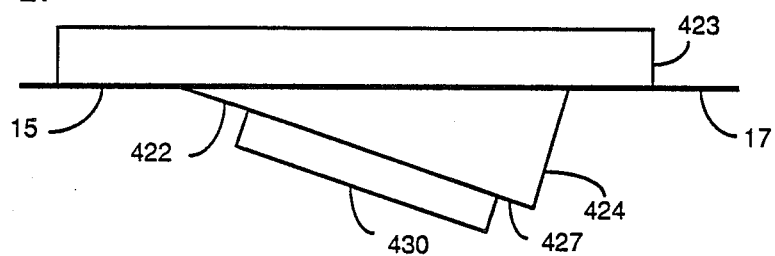
FIG. 17 illustrates a structure for an acoustooptic frequency shifter that may be included in the fiber optic rotation sensor of FIG. 9.

A frequency shifter structure that may be used in the fiber optic rotation sensor 34 of FIG. 9 is shown in FIG. 17. The frequency shifter 116 may include a length 422 of the optical fiber 15 retained between a block 423 that may be formed of quartz and a wedge 424 formed of a material such as aluminum. A metallic layer comprising Cr-Au, for example, is formed on the surface 427 of the wedge 424, and a transducer 430 formed of PZT, for example, is mounted to the metallic block 424. The transducer 430 may be driven by a suitable oscillator (not shown) to launch an acoustic wave at an angle $\theta$ in the fiber.

The fiber 15, being a single mode fiber, supports two orthogonal polarizations of the single propagation mode. There are two polarizations because the fiber is birefringent, having different refractive indices for different directions of the electric field in the fiber. The two polarizations are normally uncoupled so that there is no energy transfer from one polarization to the other. A spatially periodic stress pattern imposed on the fiber induces coupling between the two polarizations, leading to power transfer therebetween. It has been found that the power transfer is cumulative only if the spatial period of the stress pattern equals the beat length of the fiber.

Referring to FIG. 16, the beat length of the optical fiber is $L_B = \lambda/\Delta n$, where $\Delta n$ is the difference in the refractive indices for the two polarizations and $\lambda$ is the optical wavelength. It has been found that a stress pattern is most effective in causing coupling of the two polarizations when the stress is directed at 45 degrees to the principal axes of birefringence.

The transducer 430 forms a moving stress pattern in the fiber portion 422 by means of the traveling acoustic wave. If the stress pattern moves along the fiber, light coupled from one polarization to the other is shifted in frequency by an amount equal to the frequency of the moving stress pattern because of the motion of the coupling region. For convenience of reference, one of the polarizations will be referred to as "slow" and the other polarization will be referred to as "fast." The velocity of a light wave in a dielectric medium is the free space velocity of light divided by the refractive index of the dielectric medium, or $v = c/n$. Therefore, it may be seen that in a birefringent medium the polarization for which the refractive index is the greater is the slow wave and the polarization for which the refractive index is smaller is the fast wave.

Referring to FIGS. 16 and 17, a plane acoustic wavefront of wavelength $\lambda_a$ is incident upon the fiber portion 422. Phase matching occurs when the component of the beat length $L_B$ in the direction of propagation of the acoustic wave equals the acoustic wavelength. Therefore, from FIGS. 16 and 17 it is seen that $L_B \sin \theta = \lambda_a$. Using a well-known relation between wave velocity, frequency and wavelength to eliminate the acoustic wavelength from the preceding equation gives the acoustic frequency as $f = v/(L_B \sin \theta)$, where v is the acoustic wave velocity in the fiber.

The specific nature of the interaction between the acoustic wave and the two optical polarizations propagated by the fiber can be demonstrated using frequency-wave number diagrams. Referring to FIG. 18, if the acoustic wave travels in the same direction as the light in the fiber 15, light polarized in the fast mode and having a frequency ω couples to the slow mode with the resulting wave having a frequency $\omega+\omega_a$, where $\omega_a$ is the acoustic wave frequency. Light propagating in the slow mode couples to the fast mode and shifts in frequency to $\omega-\omega_a$.

As shown in FIG. 15, if the acoustic wave propagates in a direction opposite to that of the light in the fiber 15, the frequency shifting characteristics of the system reverse. Specifically, light propagating in the fast mode couples to the slow mode with a change in frequency to $\omega-\omega_a$, and light propagating in the slow mode couples to the fast mode with a change in frequency to $\omega+\omega_a$.

Therefore, the frequency shifter 420 as shown in FIG. 17 is a single side band frequency shifter if only light of a single polarization impinges upon the portion of the fiber 15 having the periodic moving stress pattern therein. In practice, the selected polarization may have small amounts of the carrier frequency and the sideband having the opposite frequency shift because of the finite extinction ratio of the polarizers included in the gyroscope and other factors.

Referring to FIG. 20, a frequency shifter 450 that may be included in the rotation sensor 34 comprises a length of the fiber 15 mounted in a grooved substrate 452. An electrode 454 is mounted in the groove 456 below the fiber 15. A portion of the fiber cladding 460 is ground away to form an interaction region 461 near the core 462. An interaction material 464 formed of an electrooptically active material is mounted on the region of the fiber where the cladding was removed. A pair of electrodes 466 and 468 are mounted on opposite ends of the interaction material, and an electrode 470 is mounted on the interaction material in generally parallel alignment with the electrode 454. An oscillator 472 supplies voltage to the electrode 470. A phase shifter 474 receives the oscillator output, shifts its phase and then applies the phase shifted signal to the electrode 468. The electrodes 466 and 456 are grounded.

Application of the oscillator signal to the interaction material 464 changes its refractive index according to the electrooptic effect. These changes in refractive index in the interaction material 464 cause changes in the effective refractive index of the fiber 15. These changes are oscillatory at the frequency of the oscillator signal. Since the speed of light is $v=c/n$ where n is the refractive index of the fiber, the changes in refractive index modulate the velocity of optical signals in the frequency shifter 450. These velocity modulations are seen as modulations in the frequency of the light.

Figure 21:
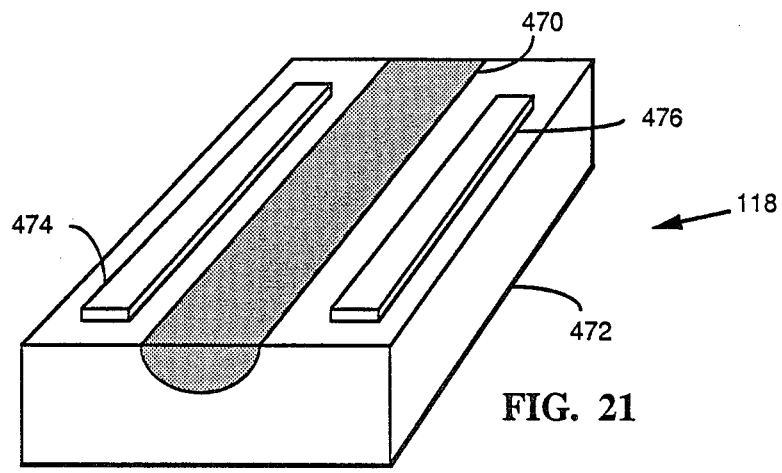
FIG. 21 is a perspective view of a phase modulator that may be included in the optical source stabilization system of FIG. 1.
Figure 22:
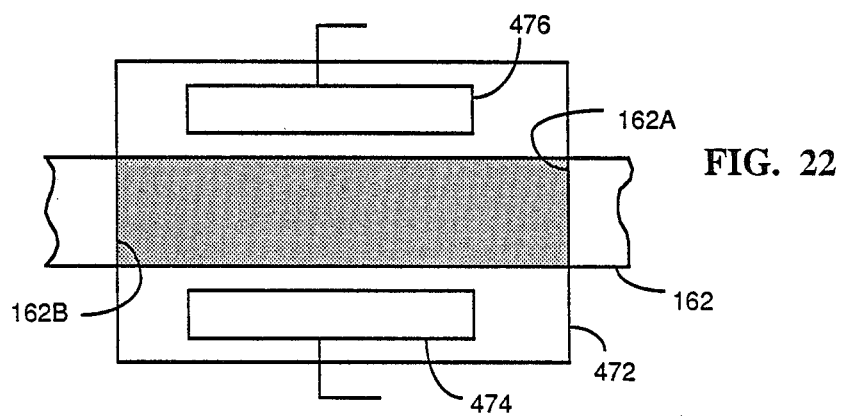
FIG. 22 is a plan view of an optical phase modulator that may be included in the fiber optic rotation sensor of FIG. 12.
Figure 23:
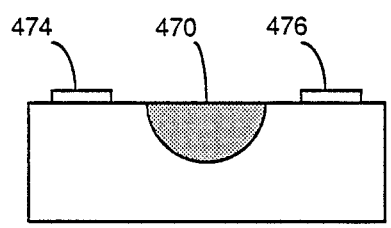
FIG. 23 is an end elevation view of the phase modulator of FIG. 20.

Referring to FIGS. 21-23, the phase modulator 117 may comprise an optical waveguide 470 formed on a substrate 472 of an electrooptically active material such as lithium niobate. A pair of electrodes 474 and 476 are attached to the substrate 472 on opposite sides of the waveguide 470. The electrodes 474 and 476 may be formed on the substrate 472 by vapor deposition of aluminum. The optical waveguide 470 may be formed in the substrate 472 by first depositing a strip of titanium on the substrate 472 and heating it to drive the titanium into the substrate 472. The resulting waveguide 470 has a generally semicircular cross section as shown in FIGS. 21-23. The fiber 162 must be cut to have two ends 162A and 162B that are butt coupled to opposite sides of the optical waveguide 470 as shown in FIG. 22.

Application of a voltage across the electrodes changes the refractive index of the optical waveguide 470 by means of the electrooptic effect. The transit time of a light wave through the waveguide 470 is the product of the length of the waveguide and its refractive index divided by the speed of light in vacuum. Changing the refractive index of the optical waveguide 470 thus changes the transit time of an optical signal through it. Because of the sinusoidal nature of the electromagnetic fields that comprise the light wave, the change in transit time is seen as a change in phase of the wave.

METHOD OF OPERATION

Referring to FIG. 1, crystals 20 and 22 have a smaller refractive index for one polarization component than for the other. Since the velocity of light in the crystals is $v=c/n$, where c is the speed of light in a vacuum and n is the refractive index of the crystal for the particular polarization under consideration, the two polarizations have different velocities in both crystal 20 and the crystal 22. The slow wave has velocity $v_s=c/n_1$, and the fast wave has velocity $v_f=c/n_2$, where $n_1$ and $n_2$ are the effective refractive indices of the crystals 20 and 22 for the slow and fast waves, respectively. The crystals 20 and 22 convert the linearly polarized light input into an elliptically polarized wave due to superposition of the orthogonal fast and slow waves.

Referring to FIG. 2, the waves traversing the two paths between the couplers 44 and 46 have different transit times because of the pathlength difference in the two fibers 14 and 48. The waves may again be referred to as fast and slow. The phase shift between these waves is processed to stabilize the frequency of the source 12.

Referring again to FIG. 2, the current outputs of the detectors 49 and 51 are $$i_1 = \{K_1 \int I_0(\omega)[1-\cos \omega\tau]d\omega\}\{\int I_0(\omega)d\omega\}^{-1} \qquad (5)$$

and $$i_2 = \{K_2 \int I_0(\omega)[1+\cos \omega\tau]d\omega\}\{\int I_0(\omega)\}^{-1}. \qquad (6)$$

The constants $K_1$ and $K_2$ are constants expressed in amperes and should be equal to one another for a balanced detector configuration. The output of the difference amplifier 55 is $$V_G = G(i_1 - i_2) \qquad (7)$$

$$V_G = G(K_2-K_1) + \{G(K_2+K_1)\int I_0(\omega)\cos \omega\tau d\omega\}\{\int I_0(\omega)d\omega\}^{-1}. \qquad (8)$$

For the ideal case of the balanced configuration in which $K_1 = K_2$ and where the spectral width of the source approaches zero, the output $V_G$ of the difference amplifier is zero when $$\omega_0\tau = (N+\tfrac{1}{2})\pi, \; N=0, 1, 2 \ldots \qquad (9)$$

Using Equation (5), the interferometer output phase shift is $$\omega\tau = \omega_0\tau + \epsilon\tau - s\tau, \qquad (10)$$

where $\epsilon\tau$ is the interferometer phase shift referenced to the zero output operating point $\omega_0\tau$ and $s\tau$ is the feedback (servo) phase shift. With $\epsilon$ as the new frequency variable, Equation (8) becomes $$V_G = G(K_2-K_1) + G(K_2+K_1)\int I_0(\epsilon) \cos[(N+\tfrac{1}{2})\pi + \epsilon\tau - s\tau]d\epsilon\{\int I_0(\epsilon)d\epsilon\}^{-1} \qquad (11)$$

$$V_G = G(K_2 - K_1) + G(K_2 + K_1)(-1)^N [A(\tau)\sin s\tau - B(\tau)\cos s\tau]. \tag{12}$$

where $$A(\tau) = \int I_o(\epsilon)\cos \epsilon\tau d\epsilon \{\int I_o(\epsilon)d\epsilon\}^{-1} \tag{13}$$

and $$B(\tau) = \int I_o(\epsilon)\sin \epsilon\tau d\epsilon \{\int I_o(\epsilon)d\epsilon\}^{-1} \tag{14}$$

Another form of Equation (12) is $$V_G = G(K_2 - K_1) + G(K_2 + K_1)(-1)^N [A^2(\tau) + B^2(\tau)]^{\frac{1}{2}} \sin[s\tau - \tan^{-1}(B(\tau)/A(\tau)]. \tag{15}$$

The expression $[A^2(\tau) + B^2(\tau)]^{\frac{1}{2}}$ is a visibility function of the optical path difference of the two legs of the interferometer and source spectral distribution; $\tan^{-1}(B(\tau)/A(\tau))$ is an input phase shift referenced to the starting point given in Equation (10); and $s\tau$ is the feedback phase shift. The variables $V_\tau$, $\theta_i$, and $\theta_f$ are defined as follows:

$$V_\tau = [A^2(\tau) + B^2(\tau)]^{\frac{1}{2}} \tag{16}$$

$$\theta_i = \tan^{-1}[(B(\tau)/A(\tau)] \tag{17}$$

$$\theta_i = \tan^{-1}\{[\int I_o(\epsilon)\sin \epsilon\tau d\epsilon][\int I_o(\epsilon)\cos \epsilon\tau d\epsilon]^{-1}\} \tag{18}$$

$$\theta_f = s\tau. \tag{19}$$

The expression in Equations (16), (17), (18) and (19) are all functions of time. Substituting them into Equation (15) gives $$V_G(t) = G(K_2 - K_1) + G(K_2 + K_1)(-1)^N V_\tau(t)\sin[\theta_f(t) - \theta_i(t)]. \tag{20}$$

The input to the low pass filter 56 of FIG. 2 is $V_G(t)$, and the output across the capacitor (not shown) is $V_{LP}(t)$. The node equation connecting both voltages is $$(1/R)[V_G(t) - V_{LP}(t)] = C\, d/dt[V_{LP}(t)]. \tag{21}$$

The voltage $V_{LP}$ is the input to the voltage to current converter 57, which produces an output current $$i_f = -\alpha V_{LP}. \tag{22}$$

In terms of the feedback current the voltage output of the difference amplifier 55 is $$V_G(t) = -RC\alpha^{-1} d/dt[i_f(t)] - \alpha^{-1} i_f(t). \tag{23}$$

The feedback current produces a feedback phase shift from the source due to the servo change in source frequency. From Equations (18) and (19) this phase shift is $$\theta_f(t) = s(t)\tau = \beta i_f(t), \tag{24}$$

and the difference amplifier output is $$V_G(t) = -RC(\alpha\beta)^{-1} d/dt[\theta_f(t)] - (\alpha\beta)^{-1}\theta_f(t). \tag{25}$$

The complete servo equation relating the input and feedback phase shift obtained from Equations (18) and (24) is $$d/dt\,\theta_f(t) + (RC)^{-1}\theta_f(t) = (RC)^{-1}(\alpha\beta G)[(K_2 - K_1) + G(K_2 + K_1)(-1)^N V_\tau(t)\sin(\theta_i(t) - \theta_f(t))]. \tag{26}$$

Equation (26) is a non-linear differential equation. Some approximations are made to make it more tractable. The visibility function $V_\tau$ is usually very weakly influenced by changes in source spectral range and may therefore, be considered to be constant. If the servo tracks well, the feedback phase shift minus the input phase shift, $\theta_f - \theta_i$, is much smaller than one radian, which means that $\sin(\theta_f(t) - \theta_i(t)) = (\theta_f(t) - \theta_i(t))$. The $(-1)^N$ term indicates the polarity of the fringe order with respect to the servo feedback. Choosing the proper polarity of $\alpha$ or $G$ eliminates uncertainty due to that term. The linearized form of Equation (26) is $$d/dt\,\theta_f(t) + (1+X)T^{-1}\theta_f(t) = XT^{-1}[\theta_i(t) - V_\tau^{-1}(K_2 - K_1)(K_2 + K_1)^{-1}] \tag{27}$$

where $$\theta_i(t) = \tan^{-1}\{[\int I_o(\epsilon)\sin \epsilon\tau d\epsilon][\int I_o(\epsilon)\cos \epsilon\tau d\epsilon]^{-1}\} \tag{28}$$

$$\theta_f(t) = s(t)\tau \tag{29}$$

$$T = RC \tag{30}$$

$$X = \alpha\beta G(K_2 + K_1)V_\tau. \tag{31}$$

The driving term in Equation (27) is $\theta_i(t)$. Its time dependence is implicit in the term $I_o(\epsilon)$, which is a function of time.

The steady state solution of Equation (27) for a constant value of $\theta_i(t)$ is $$\theta_f = (1+X)^{-1}X[\theta_i(t) - (K_2 - K_1)(K_2 + K_1)^{-1}V_\tau^{-1}]. \tag{32}$$

As the overall gain $X$ becomes large, the feedback phase shift and the input phase shift minus an offset approach one another such that the difference between them becomes very small and the servo tracks closely.

Another solution to Equation 27 is obtained for a sinusoidal input in which $$\theta_i(t) = \phi_o \sin \Omega t. \tag{33}$$

In this case, the phase $\theta_f$ is $$\theta_f(t) = X\phi_o x[(\Omega t)^2 + (1+X)^2]^{-\frac{1}{2}} \sin\{\Omega t - \tan^{-1}[\Omega t(1+X)^{-1}] - X(K_2 - K_1)[V_\tau(1+X)(K_2 + K_1)]^{-1}\}. \tag{34}$$

For high frequencies, $\Omega t$ is much larger than the overall gain $X$, and the AC feedback phase correction approaches zero. For low frequencies, $X$ is much larger that $\Omega t$. An expression for $\theta_f(t)$, similar to that of Equation (32), $$\theta_f(t) \approx X(1+X)^{-1}\{\phi_c \sin \Omega(t - T/X) - (K_2 - K_1)[V_\tau(K_2 + K_1)]^{-1}\} \tag{35}$$

It should be noted that $\theta_f(t) - \theta_i(t)$ approaches zero as the overall gain $X$ becomes much larger than one.

Figure 10:
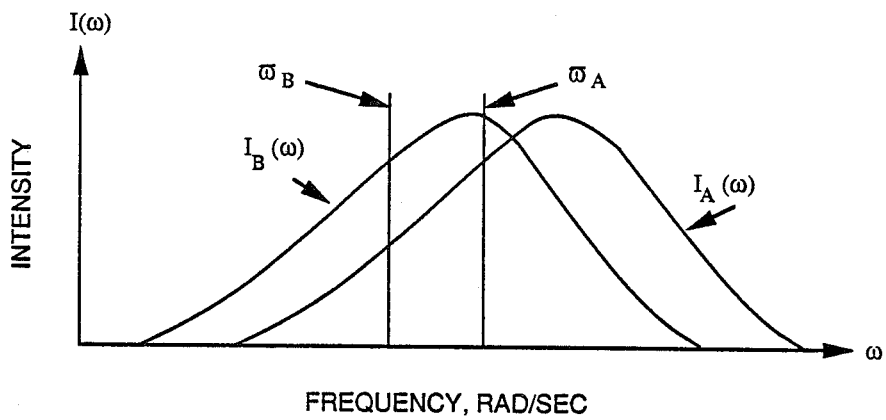
FIG. 10 graphically represents the spectral distribution of a solid state coherent light source.

FIG. 10 illustrates the spectral distribution of a single mode laser diode that may be used as the optical source 12. The phase modulator shifts the spectral distribution function $I(\omega)$ between the curves $I_A(\omega)$ and $I_B(\omega)$. The frequencies $\omega_A$ and $\omega_B$ represent the centroids of the two spectral distributions shown in FIG. 10. The centroid of the source spectral distribution represents an average wavelength or frequency that gives the closed loop gyro scale factor $S = D/(n\gamma) = fD/(nc)$ where $D$ is the diameter of the sensing loop, n is the refractive index of the fiber, $\gamma$ is the wavelength of the light, f is the frequency of the light and c is the free space velocity of light.

Without source stabilization a shift in the centroid of the spectral distribution causes a change in the scale factor by an amount $\Delta S/S = \Delta f/f$. With the source stabilization system according to the present invention, a shift in the centroid of the spectral distribution changes the output of the reference interferometer.

Figure 11:
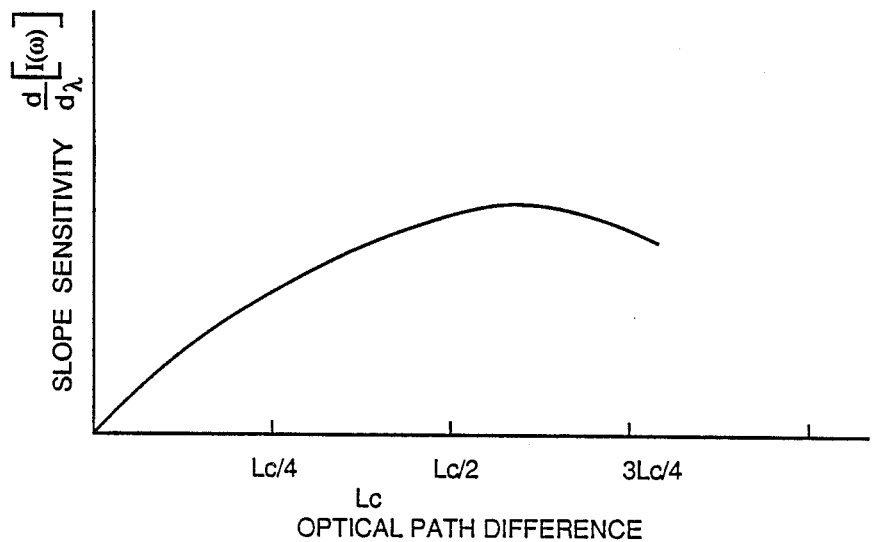
FIG. 11 graphically represents the slope sensitivity of the output of a reference interferometer that may included in the optical source stabilization system of the invention as a function of the optical path difference in the reference interferometer.

FIG. 11 graphically illustrates the slope sensitivity of the reference interferometer as a function of its optical path difference. The slope sensitivity is the derivative of the intensity of the interferometer output with respect to wavelength evaluated at the zero crossings of the interferometer output.

The optical path difference of the reference interferometer is chosen to obtain adequate correction to the centroid shift and to provide adequate slope sensitivity. The optical path difference is given in terms of the coherence length $L_c$ of the source 12. The output of the reference interferometer then is processed to provide a signal that initiates a correction to the shift in the centroid of the spectral distribution.

Figure 12:
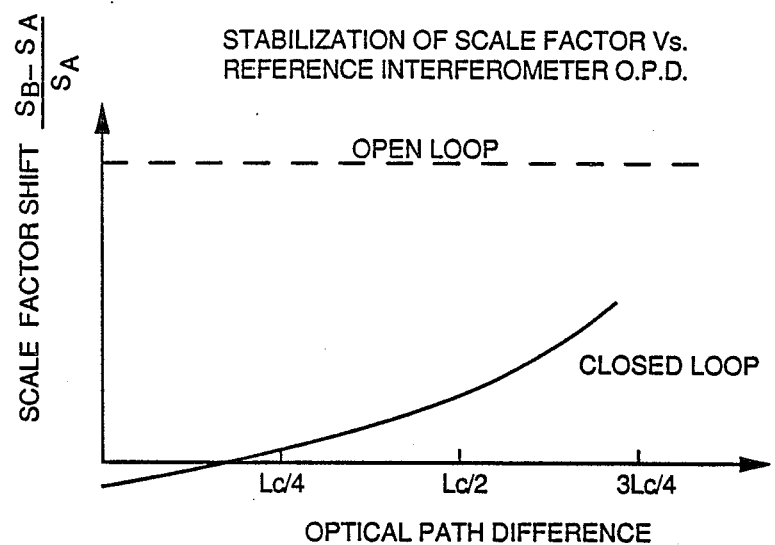
FIG. 12 graphically represents the stabilization of scale factor of a fiber optic rotation sensor versus the optical path difference in the reference interferometer.

FIG. 12 illustrates the stabilization of the scale factor as a function of the optical path difference of the reference interferometer. The optimum correction is achieved when the curve representing the shift in scale factor intersects the line that represents the optical path difference. This intersection occurs when the optical path difference is slightly less than $L_c/4$. The capability of the reference interferometer to stabilize the scale factor is a function of the optical path difference of the arms of the reference interferometer, the rotational rate of the sensing loop and the shape fo the spectral distribution. The scale factor linearity is a complicated function of the spectral shape and degrades approximately linearly with the width of the spectral distribution.

Figure 13:
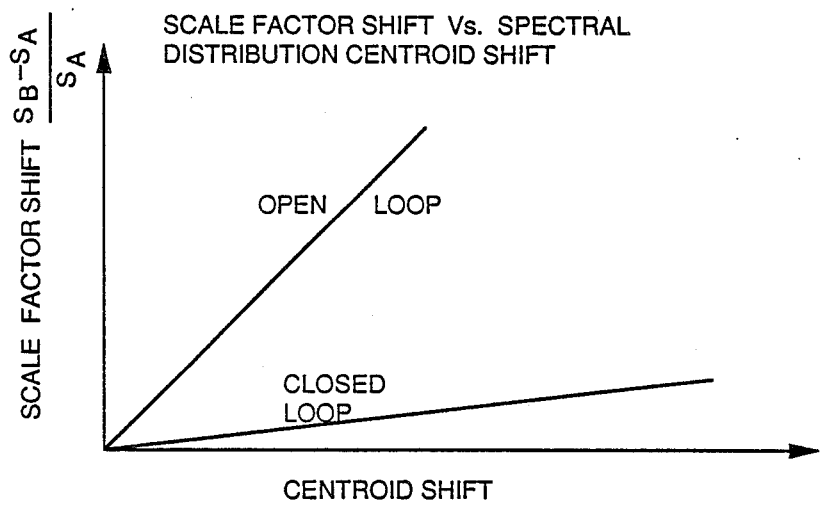
FIG. 13 graphically illustrates the shift of the scale factor of a fiber optic rotation sensor versus the shift of the centroid of the spectral distribution of the optical source.

FIG. 13 shows the scale factor shift as a function of the shift of the centroid of the spectral distribution for both open loop and closed loop operations of the fiber optic rotation sensor 34. For the closed loop case, the scale factor is much less sensitive to centroid shifts than for the open loop case.

Although the present invention has been described with reference to specific embodiments, it should be understood that these embodiments are exemplary preferred embodiments and that modifications may be made without departing from the scope of the invention as defined in the appended claims.

What is claimed is:

1. A fiber optic rotation sensing system, comprising:
   an optical source that includes a gain medium and means for defining a resonant cavity in which light emitted from the gain medium constructively interferes to produce an optical signal;
   a first optical fiber for receiving optical signals from the optical source;
   a second optical fiber having a sensing coil formed therein;
   optical coupling means for coupling optical signals between the first and second optical fibers; and
   means external from the cavity for dividing signals output from the source into a first signal portion having a first polarization and a second signal portion having a second polarization;
   a first birefringent device positioned external from the cavity to receive the first and second signal portions;
   a second birefringent device positioned external from the cavity to receive the first and second signal portions after they have propagated through the first birefringent device;
   the first and second birefringent devices being arranged to provide a first optical path for the first signal portion and a second optical path for the second signal portion;
   means for controlling the frequency of optical signals output from the optical signal source, including:
     means for providing a first optical path for the first signal portion;
     means for providing a second optical path for the second signal portion;
     means for combining the first and second signal portions to form a first optical beam and a second optical beam that each includes a component of the first signal portion and a component of the second signal portion, the beams having intensities dependent upon the frequency of the two beams; and
     means for adjusting the frequency of the optical signal output from the signal source as a function of the difference of the intensities of the first and second optical beams.

2. The device of claim 1, further comprising:
   means for producing an electrical signal indicative of the difference of the intensities of the first and second beams;
   an electric current source connected to the optical signal source for providing an electrical current to the gain medium; and
   means for applying the electrical signal to the electric current source for controlling the injection current.

3. The device of claim 2, further including:
   optical signal guiding means for guiding an optical signal output from the optical signal source, the optical signal guiding means having a pair of principal axes;
   first polarizing means having a polarization axis oriented at 45° to the principal axes of the optical signal guiding means and positioned to receive an optical signal therefrom;
   first birefringent means positioned to receive light output from the first polarizing means;
   second birefringent means positioned to receive light output from the first birefringent means;
   polarization sensitive beamsplitter means having a polarization axis oriented at 45° to the principal axes of the optical signal guiding means and positioned to receive an optical signal from the second birefringent means;
   a first photodetector positioned to receive a first output from the polarization sensitive beamsplitter, the first photodetector producing an electrical output having a phase shift indicative of $I_o(1+\cos\phi)$ where $I_o$ is the intensity of the optical beam input to the first birefringent means and $\phi$ is a phase shift between the two beams generated by the first and second birefringent means;
   a second photodetector positioned to receive a second output from the polarization sensitive beamsplitter, the second photodetector producing an electrical output having a phase shift indicative of $I_0(1-\cos\phi)$; and a differential amplifier connected to the outputs of the first and second photodetectors for producing an error signal indicative of the difference in the frequency of the optical signal output by the optical signal source from a desired frequency.

4. The device of claim 1, further including:

optical signal guiding means for guiding an optical signal output from the optical signal source, the optical signal guiding means having a pair of principal axes;

first polarizing means having a polarization axis oriented at 45° to the principal axes of the optical signal guiding means and positioned to receive an optical signal therefrom;

first birefringent means positioned to receive light output from the first polarizing means;

second birefringent means positioned to receive light output from the first birefringent means;

polarization sensitive beamsplitter means having a polarization axis oriented at 45° to the principal axes of the optical signal guiding means and positioned to receive an optical signal from the second birefringent means;

a first photodetector positioned to receive a first output from the polarization sensitive beamsplitter, the first photodetector producing an electrical output having a phase shift indicative of $I_0(1+\cos\phi)$ where $I_0$ is the intensity of the optical beam input to the first birefringent means and $\phi$ is a phase shift between the two beams generated by the first and second birefringent means;

a second photodetector positioned to receive a second output from the polarization sensitive beamsplitter, the second photodetector producing an electrical output having a phase shift indicative of $I_0(1-\cos\phi)$; and a differential amplifier connected to the outputs of the first and second photodetectors for producing an error signal indicative of the difference in the frequency of the optical signal output by the optical signal source from a desired frequency.

5. The device of claim 1, further including:

two beam interferometer means for receiving the optical signal output from the optical signal source, the interferometer comprising means for dividing the optical signal into two separate beams, a first light path, a second light path, and means for combining waves that have traversed the first and second light paths and producing first and second interferometer outputs;

first photodetector means for producing a first electrical signal indicative of the intensity of the first interferometer output;

second photodetector means for producing a first electrical signal indicative of the intensity of the second interferometer output; and a differential amplifier connected to the outputs of the first and second photodetectors for producing an error signal indicative of the difference in the frequency of the optical signal output by the optical signal source from a desired frequency.

6. The device of claim 5, further including:

low pass filter means connected to an output of the differential amplifier; and voltage to current converting means for forming a current for input to the optical source such that the optical source produces an optical signal having a frequency that causes a reduction in the error signal.

7. A method for sensing rotations, comprising the steps of:

producing a light beam with an optical source;

receiving light from the optical source with a first optical fiber;

forming a sensing coil in a second optical fiber;

coupling light between the first and second optical fibers; and controlling the frequency of an optical signal output from an optical source, including the steps of:

dividing a signal output from the source into a first signal portion and a second signal portion;

providing a first optical path for the first signal portion;

providing a second optical path for the second signal portion;

combining the first and second signal portions to form a first optical beam and a second optical beam that each includes a component of the first signal portion and a component of the second signal portion, the beams having intensities dependent upon the frequency of the two beams; and adjusting the frequency of the optical signal output from the signal source as a function of the difference of the intensities of the first and second optical beams.

8. The method of claim 7, further comprising the steps of:

producing an electrical signal indicative of the difference of the intensities of the first and second beams;

connecting an electric current source to the optical signal source for providing an injection current thereto; and applying the electrical signal to the electric current source optical source for controlling the injection current.

9. The method of claim 8, further comprising the steps of:

guiding an optical signal output from the optical signal source with an optical signal guiding means having a pair of principal axes;

placing first polarizing means having a polarization axis oriented at 45° to the principal axes of the optical signal guiding means to receive an optical signal therefrom;

placing first birefringent means to receive light output from the first polarizing means;

placing second birefringent means to receive light output from the first birefringent means;

placing polarization sensitive beamsplitter means having a polarization axis oriented at 45° to the principal axes of the optical signal guiding means to receive an optical signal from the second birefringent means;

placing a first photodetector to receive a first output from the polarization sensitive beamsplitter and produce an electrical output having a phase shift indicative of $I_0(1+\cos\phi)$ where $I_0$ is the intensity of the optical beam input to the first birefringent means and $\phi$ is a phase shift between the two beams generated by the first and second birefringent means;

placing a second photodetector positioned to receive a second output from the polarization sensitive beamsplitter, the second photodetector producing an electrical output having a phase shift indicative of $I_o(1-\cos\phi)$; and connecting a differential amplifier to the outputs of the first and second photodetectors for producing an error signal indicative of the difference in the frequency of the optical signal output by the optical signal source from a desired frequency.

10. The method of claim 9, further comprising the steps of:

guiding an optical signal output from the optical signal source, the optical signal guiding means having a pair of principal axes;

placing first polarizing means having a polarization axis oriented at 45° to the principal axes of the optical signal guiding means to receive an optical signal therefrom;

placing first birefringent means to receive light output from the first polarizing means;

placing second birefringent means to receive light output from the first birefringent means;

placing polarization sensitive beamsplitter means having a polarization axis oriented at 45° to the principal axes of the optical signal guiding means to receive an optical signal from the second birefringent means;

placing a first photodetector to receive a first output from the polarization sensitive beamsplitter and produce an electrical output having a phase shift indicative of $I_o(1+\cos\phi)$ where $I_o$ is the intensity of the optical beam input to the first birefringent means and $\phi$ is a phase shift between the two beams generated by the first and second birefringent means;

placing a second photodetector positioned to receive a second output from the polarization sensitive beamsplitter, the second photodetector producing an electrical output having a phase shift indicative of $I_o(1-\cos\phi)$; and connecting a differential amplifier to the outputs of the first and second photodetectors for producing an error signal indicative of the difference in the frequency of the optical signal output by the optical signal source from a desired frequency.

11. The method of claim 7, further including the steps of:

receiving the optical signal output from optical signal source with a two beam interferometer;

dividing the optical signal into two separate beams, a first light path, a second light path;

combining waves that have traversed the first and second light paths and producing first and second interferometer outputs;

producing a first electrical signal indicative of the intensity of the first interferometer output;

producing a first electrical signal indicative of the intensity of the second interferometer output; and producing an error signal indicative of the difference in the frequency of the optical signal output by the optical signal source from a desired frequency.

12. The method of claim 11, further including the steps of:

connecting low pass filter means to an output of the differential amplifier; and forming a current for input to the optical source such that the optical source produces an optical signal having a frequency that causes a reduction in the error signal.

* * * * *